United States Patent
Tazaki

(10) Patent No.: US 9,001,483 B2
(45) Date of Patent: Apr. 7, 2015

(54) RELAY-WELDING DETECTION CIRCUIT AND POWER SUPPLYING SYSTEM

(75) Inventor: Shintaro Tazaki, Kanagawa (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/007,713

(22) PCT Filed: Mar. 28, 2012

(86) PCT No.: PCT/JP2012/002153
§ 371 (c)(1),
(2), (4) Date: Sep. 26, 2013

(87) PCT Pub. No.: WO2012/132431
PCT Pub. Date: Oct. 4, 2012

(65) Prior Publication Data
US 2014/0016238 A1    Jan. 16, 2014

(30) Foreign Application Priority Data
Mar. 30, 2011 (JP) ................. 2011-074689

(51) Int. Cl.
*H02H 3/00* (2006.01)
*H02H 3/20* (2006.01)
*H01H 47/00* (2006.01)
*B60L 3/00* (2006.01)
(Continued)

(52) U.S. Cl.
CPC .............. *H02H 3/20* (2013.01); *H01H 47/002* (2013.01); *B60L 3/0023* (2013.01); *B60L 11/1816* (2013.01); *H01H 1/0015* (2013.01); *Y02T 10/7088* (2013.01); *Y02T 10/7005* (2013.01); *Y02T 90/121* (2013.01); *Y02T 90/14* (2013.01)

(58) Field of Classification Search
USPC ............................................ 361/88
See application file for complete search history.

(56) References Cited

U.S. PATENT DOCUMENTS 8,513,953 B2 *   8/2013    Myoen et al. ................. 324/538
2002/0057015 A1    5/2002    Kikuta et al.
(Continued)

FOREIGN PATENT DOCUMENTS

JP      05-149978 A      6/1993
JP      2000-173428 A      6/2000
(Continued)

OTHER PUBLICATIONS

International Search Report for PCT/JP2012/002153 dated May 22, 2012.

*Primary Examiner* — Scott Bauer
(74) *Attorney, Agent, or Firm* — Pearne & Gordon LLP

(57) ABSTRACT

The relay-welding detection circuit detects welding of relays (RYP, RYN) provided on a charging path from an external power supply (PW) to a first battery (14), and is provided with: a second battery (15) that can supply a welding-detection power supply independently of the external power supply (PW); a transistor switch (17) that is a circuit in which there is substantially zero current flowing in from the external power supply (PW) side of the relays, and that controls whether or not to supply the welding-detection power supply to the second battery (15) on the basis of the voltage at the external power supply (PW) side of the relays; and a control unit (18) that is electrically insulated from the transistor switch (17), and that to detects welding of the relays (RYP, RYN) on the basis of whether or not the transistor switch (17) has supplied the welding-detection power supply.

10 Claims, 6 Drawing Sheets

(51) Int. Cl.
*B60L 11/18* (2006.01)
*H01H 1/00* (2006.01)

(56) References Cited

U.S. PATENT DOCUMENTS

| | | | | |
|---|---|---|---|---|
| 2006/0021098 A1* | 1/2006 | Tezuka | | 903/922 |
| 2007/0221627 A1* | 9/2007 | Yugou et al. | | 218/136 |
| 2009/0108674 A1* | 4/2009 | Ozaki et al. | | 307/10.6 |
| 2011/0298470 A1* | 12/2011 | Gokhale et al. | | 324/522 |

FOREIGN PATENT DOCUMENTS

| | | |
|---|---|---|
| JP | 2002-153086 A | 5/2002 |
| JP | 2006-310219 A | 11/2006 |
| JP | 2009-100568 A | 5/2009 |
| JP | 2010-238576 A | 10/2010 |
| JP | 2010-252475 A | 11/2010 |
| JP | 2011-015567 A | 1/2011 |

* cited by examiner

IN NORMAL STATE (NO WELDING OCCURS)

BOTH RELAYS ARE WELDED

WHEN GROUND-SIDE RELAY IS WELDED

WHEN POWER SUPPLY-SIDE RELAY IS WELDED

RELAY-WELDING DETECTION CIRCUIT AND POWER SUPPLYING SYSTEM

TECHNICAL FIELD

The present invention relates to a relay welding detection circuit, and more particularly, to a relay welding detection circuit for detecting the welding of a relay which is used for a charging circuit for charging a battery of, for example, an electric vehicle and a power supply system including the relay welding detection circuit.

BACKGROUND ART

A relay circuit for connecting and disconnecting a quick charger to and from a battery connecting junction circuit during charging has been used in a charging circuit of an electric vehicle. A mechanical relay contact (hereinafter, abbreviated to a relay) is used in the relay circuit, and the relay is turned on and off and is welded when a high voltage is applied and a large amount of current flows. A relay welding detection circuit for detecting the welding of the relay has been known (for example, see Patent Literature 1).

In the related art, when the input-side impedance of the relay welding detection circuit is not a predetermined value (for example, 1 MΩ or less), for example, the problem that a current flows from a quick charger to the welding detection circuit arises. Therefore, it is necessary to increase the input-side impedance of the relay welding detection circuit. In addition, when a detection voltage is insulated and detected, it is necessary to supply driving power to the secondary side.

CITATION LIST

Patent Literature

PTL 1
Japanese Patent Application Laid-Open No. 2006-310219

SUMMARY OF INVENTION

Technical Problem

In the relay welding detection circuit according to the related art, power for an insulating device, such as a photocoupler, is ensured from the quick charger. Therefore, the impedance of the relay welding detection circuit is low, and the quick charger determines that to a current flowing to the impedance is a leakage current and does not start charging.

An object of the present invention is to provide a relay welding detection circuit which can have high impedance and a power supply system using the relay welding detection circuit.

Solution to Problem

According to an aspect of the present invention, there is provided a relay welding detection circuit that is provided in a charging path from an external power supply to an electric storage apparatus, that includes a power supply-side relay and a ground-side relay whose on or of state is independently controllable, and that detects the welding of the relays. The relay welding detection circuit includes: a power supply section that is capable of supplying welding detection power independently from the external power supply; a voltage detection circuit to which almost no current flows from a side of the power supply-side relay close to the external power supply and which controls Whether to supply the welding detection power to the power supply section on the basis of a voltage on the external power supply side of the power supply-side relay; and a control section that independently controls the on or off state of the power supply-side relay and the ground-side relay, that detects the welding of the relays on the basis of whether the voltage detection circuit has supplied the welding detection power, and that is electrically insulated from the voltage detection circuit.

According to another aspect of the present invention, there is provided a power supply system for an electric vehicle that supplies/cuts off a current to an electric storage apparatus for supplying power to a vehicle driving motor in a charging path from an external power supply to the electric storage apparatus. The power supply system includes: a relay welding detection circuit that includes a power supply-side relay and a ground-side relay whose on or off state is independently controllable and that detects the welding of the relays; a power supply section that is capable of supplying welding detection power independently from the external power supply; a voltage detection circuit to which almost no current flows from a side of the power supply-side relay close to the external power supply and which controls whether to supply the welding detection power to the power supply section on the basis of a voltage on the external power supply side of the power supply-side relay; and a control section that independently controls the on or off state of the power supply-side relay and the ground-side relay that detects the welding of the relays on the basis of whether the voltage detection circuit has supplied the welding detection power, and that is electrically insulated from the voltage detection circuit. The voltage detection circuit is a switch using a transistor. A collector terminal of the transistor is electrically connected to a positive terminal of the power supply section. An emitter terminal of the transistor is electrically connected to a charging path on the external power supply side of the ground-side relay. A base terminal of the transistor is electrically connected to a charging path on the external power supply side of the power supply-side relay. A negative terminal of the power supply section is connected to a negative terminal of the electric storage apparatus.

Advantageous Effects of Invention

According to the present invention, it is possible to provide a relay welding detection circuit which can have high impedance and a power supply system including the relay welding detection circuit.

DESCRIPTION OF EMBODIMENTS

Hereinafter, exemplary embodiments of the present invention will be described with reference to the accompanying drawings.

Embodiment 1

Figure 1:
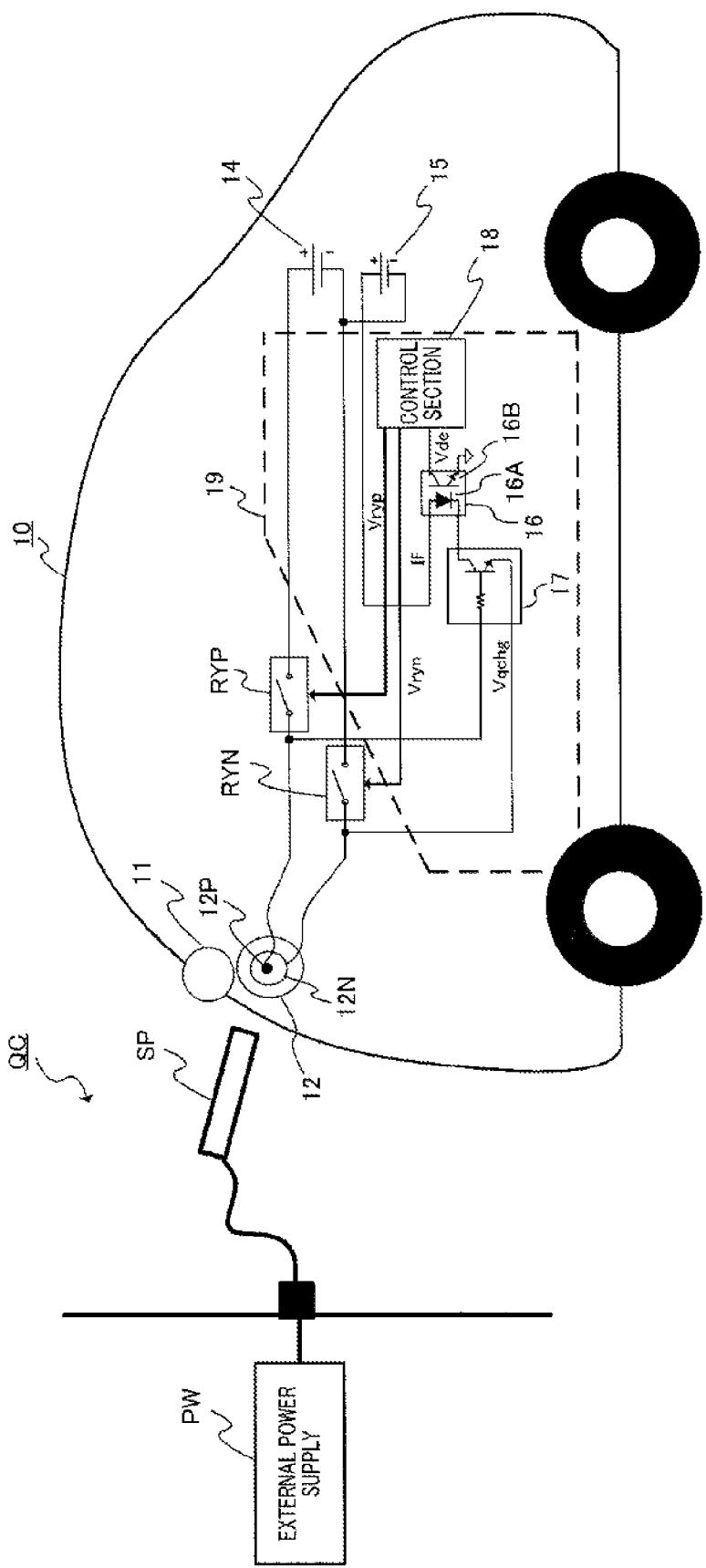
FIG. 1 is a diagram illustrating the schematic structure of a power supply system of an electric vehicle according to Embodiment 1 of the present invention.

FIG. 1 is a diagram illustrating the schematic structure of a power supply system of an electric vehicle according to Embodiment 1.

Charging terminal 12 is provided in body 10 of the electric vehicle. Cover 11 is provided in charging terminal 12. When charging is not performed, cover 11 is closed and charging terminal 12 is shielded from the outside. When charging is performed, cover 11 is opened. During charging, power is supplied from external power supply PW to charging terminal 12 through power supply plug SP.

A positive (+) terminal of first battery 14 for supplying power to a vehicle driving motor is connected to power supply-side terminal 12P of charging terminal 12 through power supply-side relay RYP.

Ground-side terminal 12N of charging terminal 12 is connected to a negative (−) terminal of the first battery through ground-side relay RYN.

In addition, a negative terminal of second battery 15 (power supply section) for supplying power to in-vehicle accessories is connected to the negative terminal of first battery 14.

A positive terminal of second battery 15 is connected to an anode terminal of photodiode 16A forming photocoupler 16 and a cathode terminal of photodiode 16A is connected to a collector terminal of transistor switch 17.

An emitter terminal of transistor switch 17 is connected to ground-side terminal I2N of charging terminal 12 and a base terminal thereof is connected to power supply-side terminal 12P (the side of power supply-side relay RYP close to external power supply PW of charging terminal 12 through current-limiting resistor R. A transistor (for example, an FET or a MOS transistor) is used as the switch since the impedance of the terminal for controlling the turning on and off of the switch is very high. That is, the amount of current flowing from the side of power supply-side relay RYP close to external power supply PW to transistor switch 17 (corresponding to a voltage detection circuit) is nearly zero.

A collector of phototransistor 16B forming photocoupler 16 is connected to a voltage detection terminal of control section (controller) 18. An emitter terminal of phototransistor 16B is connected to the body ground of the vehicle. Control section 18 is electrically insulated from the high voltage side (transistor switch 17) by photocoupler 16.

Control section 18 forms relay welding determining apparatus 19 that outputs control signal Vryp for controlling the turning an and off of power supply-side relay RYP and control signal Vryn for controlling the turning on and off of ground-side relay RYN.

Figure 2:
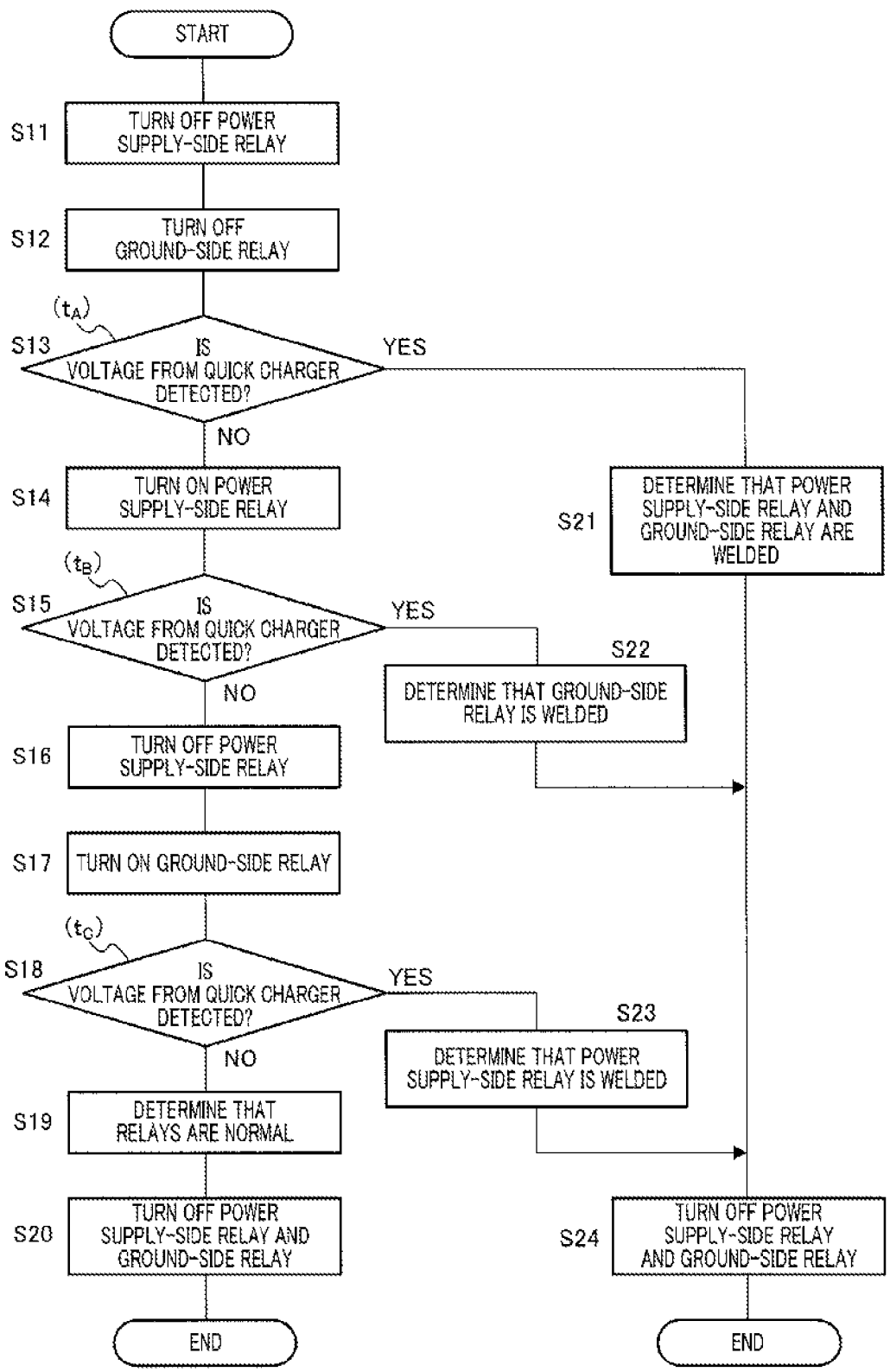
FIG. 2 is a flowchart illustrating the process of an operation according to the embodiment.

Next, an operation according to Embodiment 1 will be described. FIG. 2 is a flowchart illustrating the process of a welding detection operation according to Embodiment 1. In the welding detection operation, control section 18 controls power supply-side relay RYP and ground-side relay RYN and determines whether the voltage output from first battery 14 is transmitted to the side of power supply-side relay RYP close to the external power supply PW to detect welding during the control operation. When electric energy is supplied from external power supply PW to first battery 14, the voltage on the side of power supply-side relay RYP close to external power supply PW is fixed to the voltage supplied from external power supply PW. Therefore, the welding detection operation s performed when no electric energy is supplied from external power supply PW to first battery 14.

First, control section 18 performs a control operation of outputting control signal Vryp to power supply-side relay RYP to turn off power supply-side relay RYP (Step S11).

The expression 'control operation of turning off power supply-side relay RYP' is used since it is difficult to turn off power supply-side relay RYP when power supply-side relay RYP is in a welded state.

FIGS. 3A to 3D are timing charts according to Embodiment 1.

Control section 18 performs a control operation of outputting control signal Vryn to ground-side relay RYN to turn off ground-side relay RYN (Step S12).

The expression 'control operation of turning off ground-side relay RYN' is used since it is difficult to turn off ground-side relay RYN when ground-side relay RYN is in a welded state.

Then, control section 18 determines whether a voltage is detected from voltage detection terminal Vde, that is whether a voltage from quick charger QC is detected (Step S13; time $t_A$).

When it is determined in Step S13 that an abnormal voltage is detected from voltage detection terminal Vde (Yes in Step S13), it is determined that power supply-side relay RYP and ground-side relay RYN are welded (Step S21).

Figure 3A:
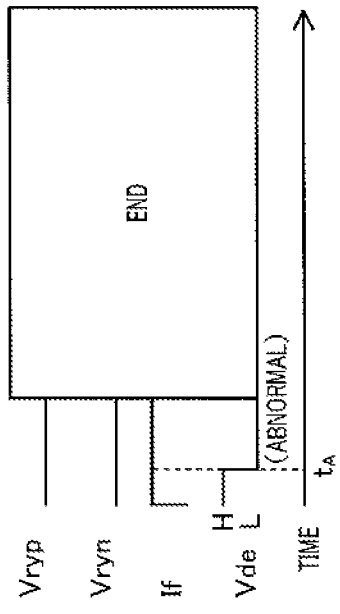
FIGS. 3A to 3D are timing charts of the embodiment.
Figure 3B:
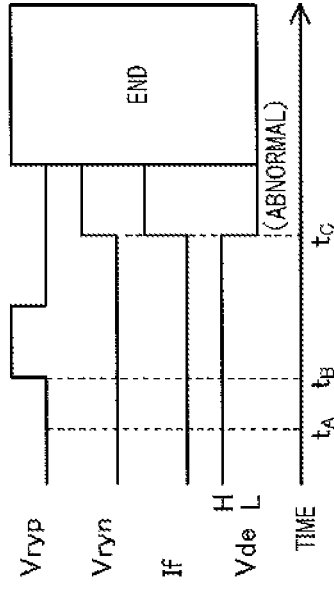

Specifically, it is determined that the relays are welded when the voltage of voltage detection terminal Vde is changed from an "H" level to an "L" level at time $t_A$, as illustrated in the timing chart of FIG. 3B.

Control section 18 performs a control operation of outputting control signal Vryp to power supply-side relay RYP to turn off power supply-side relay RYP and a control operation of outputting control signal Vryn to ground-side relay RYN to turn off ground-side relay RYN and ends the process (Step S24).

When it is determined in Step S13 that an abnormal voltage is not detected from voltage detection terminal Vde (No in Step S13), control section 18 outputs control signal Vryp to power supply-side relay RYP to turn on power supply-side relay RYP since at least one of power supply-side relay RYP and ground-side relay RYN is in an off state at that time (Step S14).

Then, control section 18 determines whether a voltage is detected from voltage detection terminal Vde, that is whether a voltage from quick charger QC is detected (Step S15; time $t_B$).

When it is determined in Step S15 that an abnormal voltage is detected from voltage detection terminal Vde (Yes in Step S15), it is determined that ground-side relay RYN is welded (Step S22).

Figure 3C:
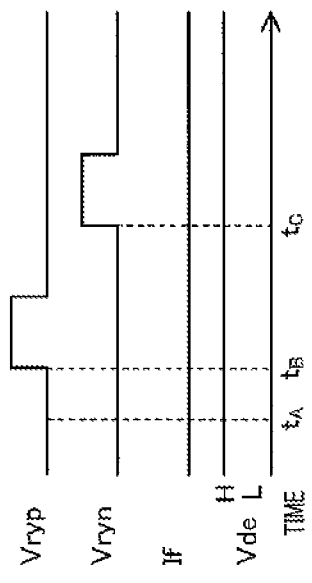

Specifically, it is determined that the relay is welded when the voltage of voltage detection terminal Vde is at the "H" level at time $t_A$, but is changed from the "H" level to the "L" level at time $t_B$, as illustrated in the timing chart of FIG. 3C.

Figure 3D:
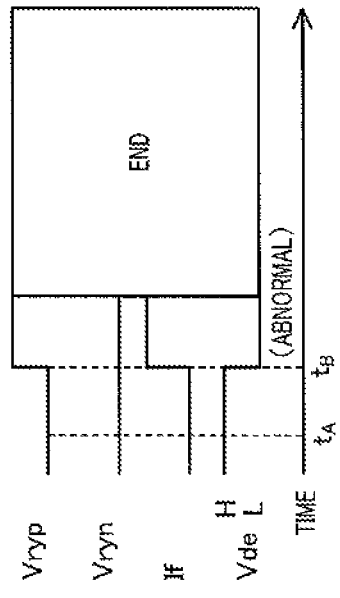

Then, control section 18 performs a control operation of outputting control signal Vryp to power supply-side relay RYP to turn off power supply-side relay RYP and a control operation of outputting control signal Vryn to ground-side relay RYN to turn off ground-side relay RYN (Step S24) and ends the process (end). In FIGS. 3B to 3D, "end" is the same meaning as "end" illustrated in FIG. 2.

When it is determined in Step S15 that a voltage is not detected from voltage detection terminal Vde (No in Step S15), the control section 18 performs a control operation of outputting control signal Vryp to power supply-side relay RYP to turn off power supply-side relay RYP since ground-side relay RYN is not welded and is in an off state at that time (Step S16).

Then, control section 18 outputs control signal Vryn to ground-side relay RYN to turn on ground-side relay RYN (Step S17).

Then, control section 18 determines whether a voltage is detected from voltage detection terminal Vde, that is, whether a voltage from quick charger QC is detected (Step S18; time $t_C$).

When it is determined in Step S18 that an abnormal voltage is detected from voltage detection terminal Vde (Yes in Step S18), it is determined that power supply-side relay RYP is welded (Step S23).

Specifically, it is determined that the relay is welded when the voltage of voltage detection terminal Vde is at the "H" level at time $t_A$ and time $t_B$ and is changed to the "L" level at time $t_C$, as illustrated in the timing chart of FIG. 3D.

Then, control section 18 performs a control operation of outputting control signal Vryp to power supply-side relay RYP to turn of power supply-side relay RYP and a control operation of outputting control signal Vryn to ground-side relay RYN to turn off ground-side relay RYN (Step S24) and ends the process (end).

When it is determined in Step S18 that an abnormal voltage is not detected from voltage detection terminal Vde (No in Step S18), it is determined that power supply-side relay RYP and ground-side relay RYN are not welded, that is, power supply-side relay RYP and ground-side relay RYN are normal (Step S19).

In this state, specifically, it is determined that the voltage detection terminal Vde is maintained at the "H" level at any of times $t_A$, $t_B$, and $t_C$, as illustrated in the timing chart of FIG. 3A.

Then, the control section outputs control signal Vryp to power supply-side relay RYP to turn off power supply-side relay RYP and ground-side relay RYN (Step S20) and ends the process (end).

As described above, according to Embodiment 1, it is possible to form a high-impedance relay welding detection circuit capable of reliably detecting the welding state of the relay, without using power from the external power supply and to perform an appropriate process such as a warning process.

Embodiment 2

Figure 4:
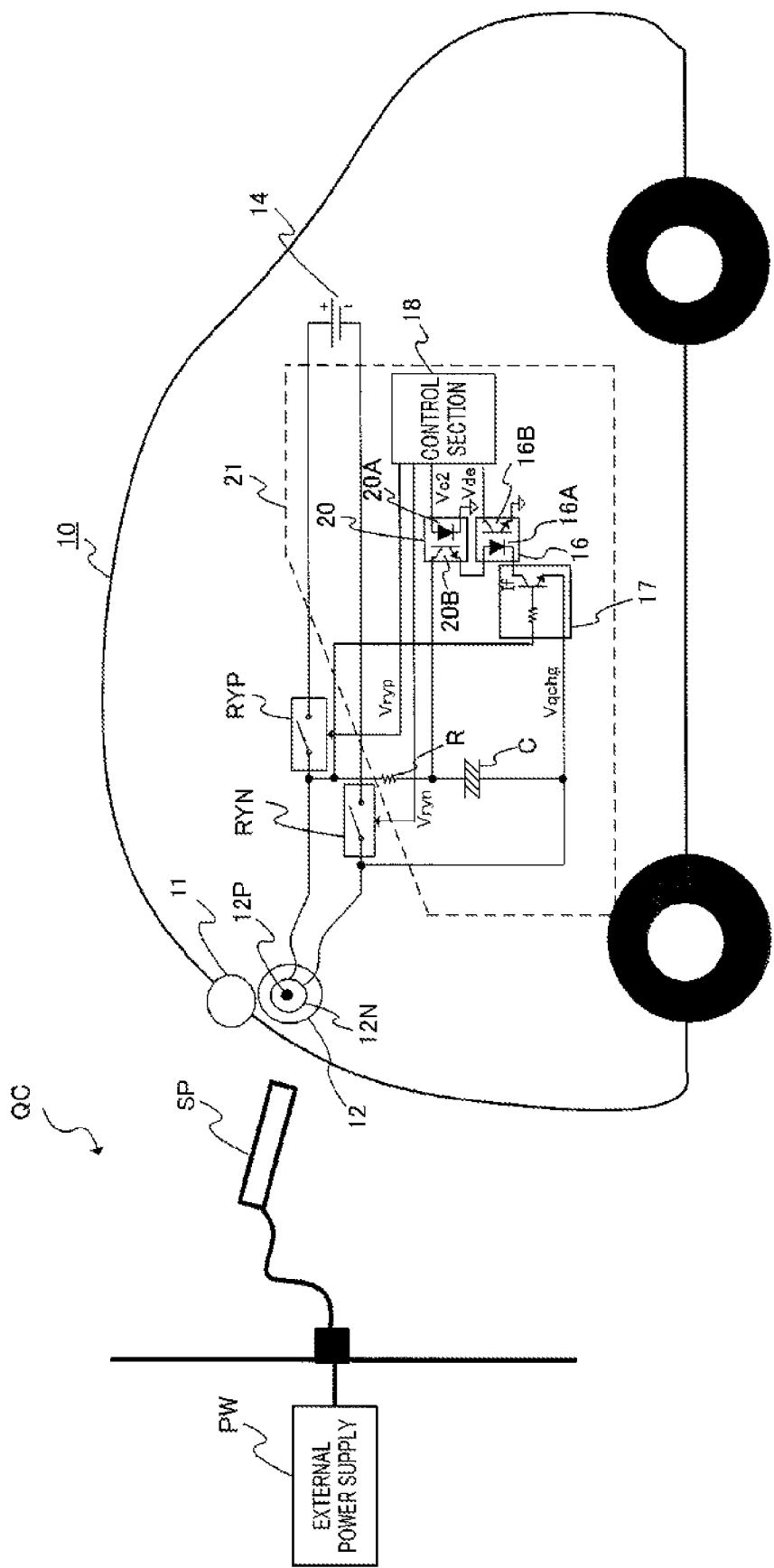
FIG. 4 is a diagram illustrating the schematic structure of a power supply system of an electric vehicle according to Embodiment 2 of the present invention.

FIG. 4 is a diagram illustrating the schematic structure of a power supply system of an electric vehicle according to Embodiment 2. In FIG. 4, the same components as those in FIG. 1 are denoted by the same reference numerals.

A positive terminal of battery 14 for supplying power to a vehicle driving motor is connected to power supply-side terminal 12P of charging terminal 12 of electric vehicle 10 through power supply-side relay RYP. Ground-side terminal 12N of charging terminal 12 is connected to a negative terminal of battery 14 through ground-side relay RYN.

In addition, one terminal of capacitor (power supply section) C for supplying power to in-vehicle accessories is connected to power supply-side terminal 12P of charging terminal 12 through current-limiting resistor R. Ground-side terminal 12N of charging terminal 12 is connected to the other terminal of capacitor C.

A collector of phototransistor 20B forming second photocoupler 20 is connected to a connection point between capacitor C and current-limiting resistor R.

An anode terminal of photodiode 20A forming second photocoupler 20 is connected to control terminal Vc2 of control section 18, and a cathode terminal thereof is connected to the body ground of vehicle body 10.

An emitter terminal of phototransistor 20B is connected to an anode terminal of photodiode 16A forming first photocoupler 16 and a cathode terminal of photodiode 16A is connected to a collector of transistor switch 17.

An emitter terminal of transistor switch 17 is connected to ground-side terminal 12N of charging terminal 12, and a base thereof is connected to power supply-side terminal 12P of charging terminal 12 through current-limiting resistor R.

A collector of phototransistor 16B forming first photocoupler 16 is connected to voltage detection terminal Vde of control section (controller) 18. An emitter of phototransistor 16B is connected to the body ground of vehicle body 10.

Control section 18 farms relay welding determining apparatus 21 that outputs control signal Vryp for controlling the turning on and off of power supply-side relay RYP and control signal Vryn for controlling the turning on and off of ground-side relay RYN. Control section 18 outputs an "H" level control signal from control terminal Vc2 when it is determined whether the relay is welded.

Figure 5:
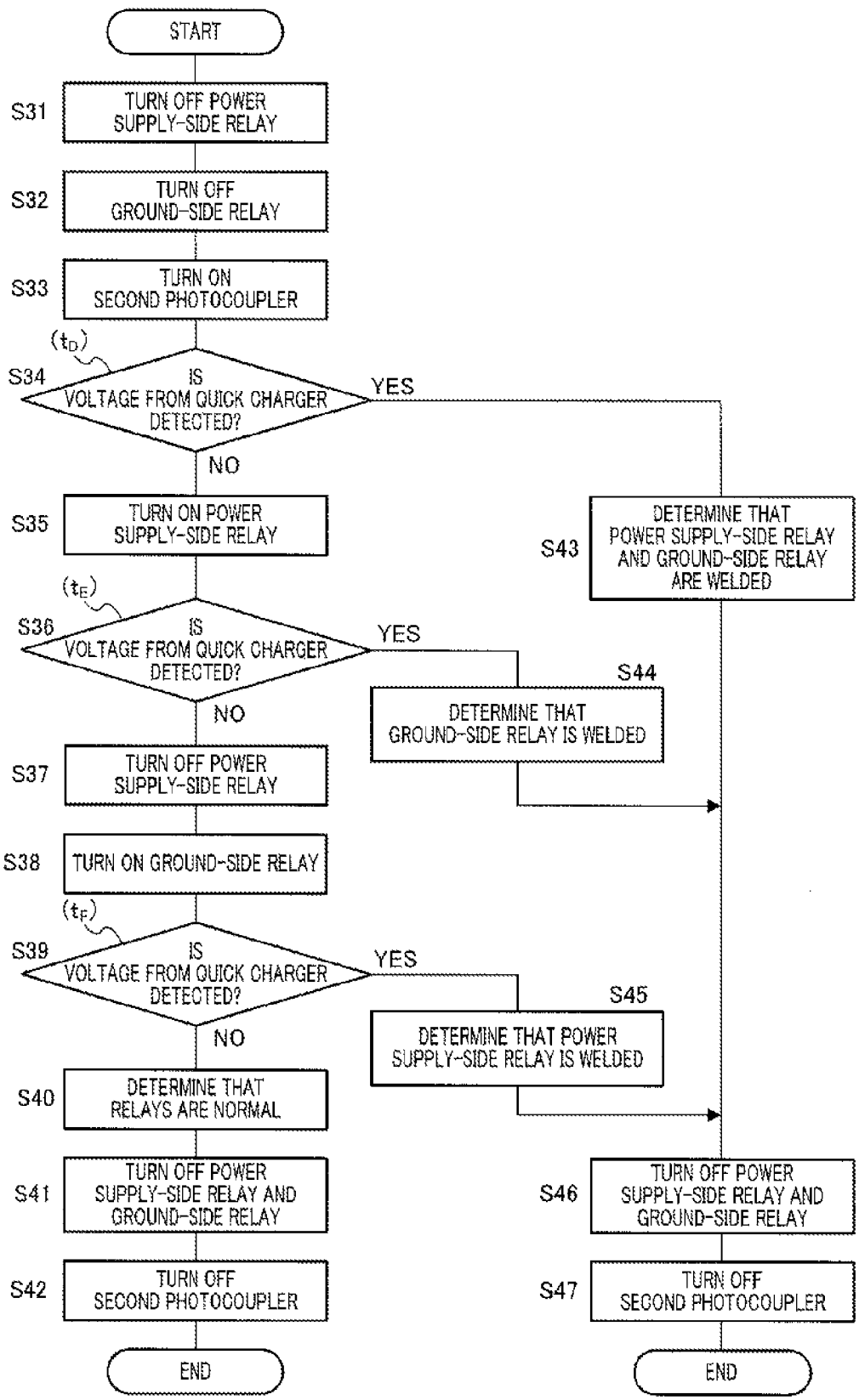
FIG. 5 is a flowchart illustrating the process of an operation according to the embodiment.

Next, an operation according to Embodiment 2 will be described. FIG. 5 is a flowchart illustrating a welding detection operation according to Embodiment 2.

First, control section 18 performs a control operation of outputting control signal Vryp to power supply-side relay RYP to turn off power supply-side relay RYP (Step S31).

Here, similarly to Embodiment 1, the expression 'control operation of turning off power supply-side relay RYP' is used since it is difficult to turn off power supply-side relay RYP when power supply-side relay RYP is in a welded state.

Then, control section 18 performs a control operation of outputting control signal Vryn to ground-side relay RYN to turn off ground-side relay RYN (Step S32).

The expression 'control operation of turning off ground-side relay RYN' used since it is difficult to turn off ground-side relay RYN when ground-side relay RYN is in a welded state.

Control section 18 outputs an "H" level control signal from control terminal Vc2 to turn on second photocoupler 20 (Step S33).

As a result, power can be supplied to photodiode 16A of first photocoupler 16.

Then, control section 18 determines whether an abnormal voltage is detected from voltage detection terminal Vde, that is, whether a voltage from quick charger QC is detected (Step S34; time $t_D$).

When it is determined in Step S34 that an abnormal voltage is detected from voltage detection terminal Vde (Yes in Step S34), it is determined that power supply-side relay RYP and ground-side relay RYN are welded (Step S43).

Figure 6A:
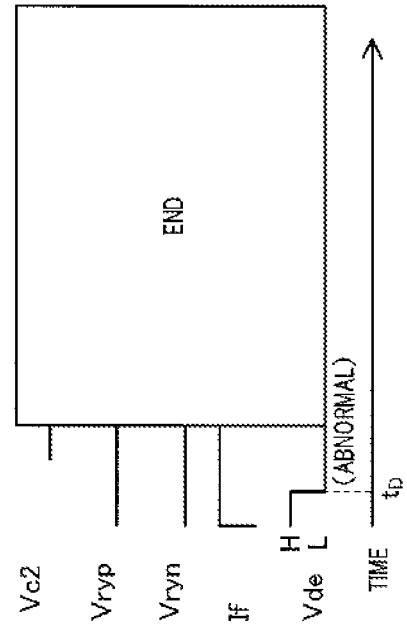
FIGS. 6A to 6D are timing charts of the embodiment.
Figure 6B:
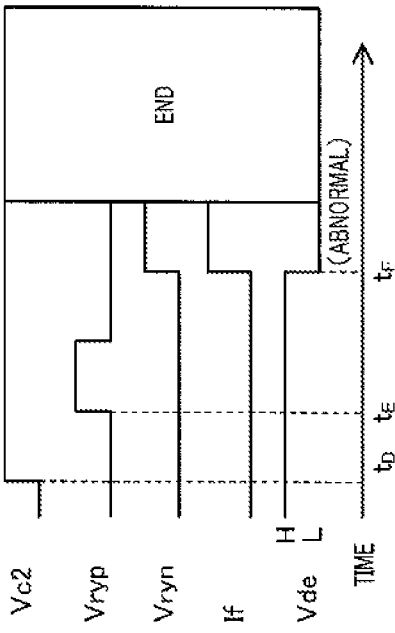

Specifically, it is determined that the relays are welded when the voltage of voltage detection terminal Vde is changed to an "L" level at time $t_D$, as illustrated in the timing chart of FIG. 6B.

Then, control section 18 performs a control operation of outputting control signal Vryp to power supply-side relay RYP to turn of power supply-side relay RYP and a control operation of outputting control signal Vryn to ground-side relay RYN to turn off ground-side relay RYN (Step S46), outputs an "L" level control signal from control terminal Vc2 to turn off second photocoupler 20 (Step S47), and ends the process (end).

When it is determined in Step S34 that an abnormal voltage is not detected from voltage detection terminal Vde (No in Step S34), control section 18 outputs control signal Vryp to power supply-side relay RYP to turn on power supply-side relay RYP since at least one of power supply-side relay RYP and ground-side relay RYN is in an off state at that time (Step S35).

Then, control section 18 determines whether an abnormal voltage is detected from the voltage detection terminal Vde, that is, whether a voltage from quick charger QC is detected (Step S36; time $t_E$).

When it is determined in Step S36 that an abnormal voltage is detected from voltage detection terminal Vde (Yes in Step S36), it is deter that ground-side relay RYN is welded (Step S44).

Figure 6C:
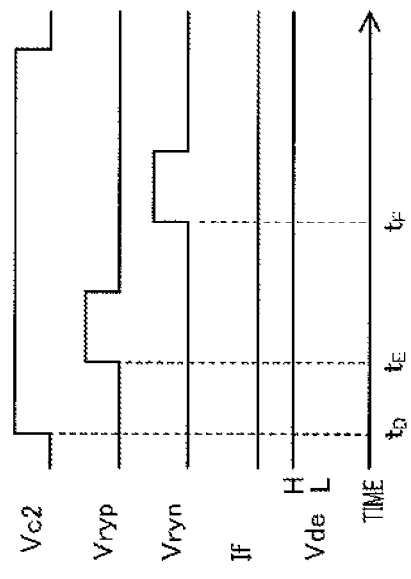

Specifically, it is determined that the relay is welded when the voltage of voltage detection terminal Vde is at an "H" level at time $t_D$ and is changed to an "L" level at time $t_E$, as illustrated in the timing chart of FIG. 6C.

Then, control section 18 performs a control operation of outputting control signal Vryp to power supply-side relay RYP to turn off power supply-side relay RYP and a control operation of outputting control signal Vryn to ground-side relay RYN to turn off ground-side relay RYN (Step S46), outputs an "L" level control signal from control terminal Vc2 to turn off second photocoupler 20 (Step S47), and ends the process (end).

When it is determined in Step S36 that an abnormal voltage is not detected from voltage detection terminal Vde (No in Step S36), the control section performs a control operation of outputting control signal Vryp to power supply-side relay RYP to turn off power supply-side relay RYP since pound-side relay RYN is not welded and is in an off state at that time (Step S37).

Then, control section 18 outputs control signal Vryn to ground-side relay RYN to turn on ground-side relay RYN (Step S38).

Then, control section 18 determines whether an abnormal voltage is detected from voltage detection terminal Vde, that is, whether a voltage from the quick charger is detected (Step S39; time $t_F$).

When it is determined in Step S39 that an abnormal voltage is detected from voltage detection terminal Vde (Yes in Step S39), it is determined that power supply-side relay RYP is welded (Step S45).

Figure 6D:
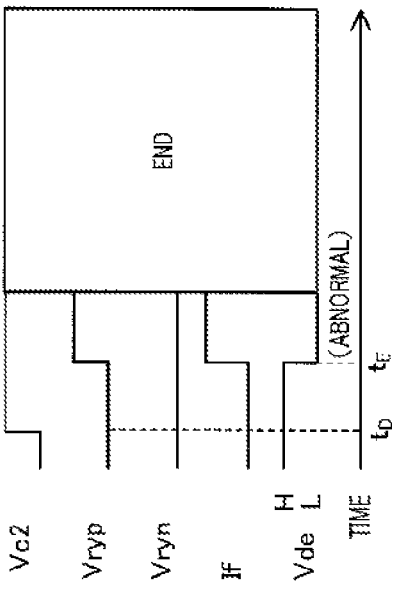

Specifically, it is determined that the relay is welded when the voltage of voltage detection terminal Vde is maintained at an "H" level at any of times $t_D$ and $t_E$, but is changed to an "L" level at time $t_F$, as illustrated in the timing chart of FIG. 6D.

Then, control section 18 performs a control operation of outputting control signal Vryp to power supply-side relay RYP to turn off power supply-side relay RYP and a control operation of outputting control signal Vryn to ground-side relay RYN to turn off ground-side relay RYN (Step S46), outputs an "L" level control signal from control terminal Vc2 to turn off second photocoupler 20 (Step S47), and ends the process (end).

When it is determined in Step S39 that an abnormal voltage is not detected from voltage detection terminal Vde (No in Step S39), it is determined that power supply-side relay RYP and ground-side relay RYN are not welded, that is, whether power supply-side relay RYP and ground-side relay RYN are normal (Step S40).

Specifically, this state is obtained when the voltage of voltage detection terminal Vde is maintained at an "H" level at any of times $t_D$, $t_E$, and $t_F$, as illustrated in the timing chart of FIG. 6A.

Then, the control section outputs control signal Vryp to power supply-side relay RYP to turn off power supply-side relay RYP and ground-side relay RYN (Step S41).

Then, control section 18 outputs an "L" level control signal from control terminal Vc2 to turn off second photocoupler 20 (Step S42) and ends the process (end).

As described above, according to Embodiment 2, it is possible to form a high-impedance relay welding detection circuit capable of reliably detecting the welding state of the relay, without using power from the external power supply, and perform an appropriate process such as a warning process.

The disclosure of Japanese Patent Application No. 2011-074689, filed on Mar. 30, 2011, including the specification, drawings and abstract, is incorporated herein by reference in its entirety.

INDUSTRIAL APPLICABILITY

The relay welding detection circuit and the power supply system using the relay welding detection circuit according to the present invention can he applied to a so-called hybrid vehicle or plug-in hybrid vehicle, in addition to the electric vehicle driven by the battery.

REFERENCE SIGNS LIST

10 Vehicle
11 Cover
12 Charging terminal
12N Ground-side terminal
12P Power supply-side terminal
14 First battery
15 Second battery (Power supply section, Electric storage section)
16 Photocoupler
16A Photodiode
16B Phototransistor
17 Transistor switch
18 Control section
19 Relay welding determining apparatus
20 Second photocoupler
20A Photodiode
20B Phototransistor
21 Relay welding determining apparatus
C Capacitor (Power supply section, Electric storage section)
PW External power supply
QC Quick charger
R Current-limiting resistor
RYN Ground-side relay
RYP Power supply-side relay
SP Power supply plug
Vc2 Control terminal
Vde Voltage detection terminal
Vryn Control signal
Vryp Control signal

The invention claimed is:

1. A relay welding detection circuit that is provided in a charging path from an external power supply to an electric storage apparatus, that includes a power supply-side relay and a ground-side relay whose on or off state is independently controllable, and that detects the welding of the relays, the circuit comprising:

a power supply section that is capable of supplying welding detection power independently from the external power supply;

a voltage detection circuit to which almost no current flows from a side of the power supply-side relay close to the external power supply and which controls whether to supply the welding detection power to the power supply section on the basis of a voltage on the external power supply side of the power supply-side relay; and a control section that independently controls the on or off state of the power supply-side relay and the ground side relay, that detects the welding of the relays on the basis of whether the voltage detection circuit has supplied the welding detection power, and that is electrically insulated from the voltage detection circuit.

2. The relay welding detection circuit according to claim 1, wherein the voltage detection circuit is a switch using a transistor, a collector terminal of the transistor is electrically connected to a positive terminal of the power supply section, an emitter terminal of the transistor is electrically connected to a charging path on the external power supply side of the ground-side relay, a base terminal of the transistor is electrically connected to a charging path on the external power supply side of the power supply-side relay, and a negative terminal of the power supply section is connected to a negative terminal of the electric storage apparatus.

3. The relay welding detection circuit according to claim 1, wherein a welding detection operation is performed when no electric energy is supplied from the external power supply to the electric storage apparatus.

4. The relay welding detection circuit according to claim 1, wherein the voltage detection circuit is electrically insulated from the control section by a photocoupler, and the control section determines whether the voltage detection circuit has supplied the welding detection power through the photocoupler.

5. The relay welding detection circuit according to claim 1, wherein the power supply section includes an electric storage section that stores power supplied from the external power supply through a resistor.

6. The relay welding detection circuit according to claim 1, wherein the power supply section includes:

a capacitor that stores power supplied from the external power supply through a resistor; and a second photocoupler that cuts of the supply of power to the voltage detection circuit through the photocoupler when the welding detection operation is not performed, and the control section controls the second photocoupler during the welding detection operation and supplies the welding detection power from the power supply section to the voltage detection circuit through the photocoupler.

7. The relay welding detection circuit according to claim 1, wherein the control section detects that the power supply-side relay and the ground-side relay are in a welded state when the voltage detection circuit detects a welding detection voltage during a control operation of turning off both the power supply-side relay and the ground-side relay.

8. The relay welding detection circuit according to claim 7, wherein the control section detects that the ground-side relay is in a welded state when the voltage detection circuit detects the welding detection voltage during a control operation of turning on the power supply-side relay and turning off the ground-side relay.

9. The relay welding detection circuit according to claim 6, wherein the control section detects that the power supply-side relay is in a welded state when the voltage detection circuit detects a welding detection voltage during a control operation of turning off the power supply-side relay and turning on the ground-side relay.

10. A power supply system for an electric vehicle that supplies/cuts off a current to an electric storage apparatus for supplying power to a vehicle driving motor in a charging path from an external power supply to the electric storage apparatus, the system comprising:

a relay welding detection circuit that includes a power supply-side relay and a ground-side relay whose on or off state is independently controllable and that detects the welding of the relays;

a power supply section that is capable of supplying welding detection power independently from the external power supply;

a voltage detection circuit to which almost no current flows from a side of the power supply-side relay close to the external power supply and which controls whether to supply the welding detection power to the power supply section on the basis of a voltage on the external power supply side of the power supply-side relay; and a control section that independently controls the on or off state of the power supply-side relay and the ground-side relay, that detects the welding of the relays on the basis of whether the voltage detection circuit has supplied the welding detection power, and that is electrically insulated from the voltage detection circuit, wherein the voltage detection circuit is a switch using a transistor, a collector terminal of the transistor is electrically connected to a positive terminal of the power supply section, an emitter terminal of the transistor is electrically connected to a charging path on the external power supply side of the ground-side relay, a base terminal of the transistor is electrically connected to a charging path on the external power supply side of the power supply-side relay, and a negative terminal of the power supply section is connected to a negative terminal of the electric storage apparatus.

* * * * *